(12) United States Patent
Wang et al.

(10) Patent No.: US 8,937,493 B2
(45) Date of Patent: Jan. 20, 2015

(54) TERNARY T ARITHMETIC CIRCUIT

(71) Applicant: Ningbo University, Ningbo (CN)

(72) Inventors: Pengjun Wang, Ningbo (CN); Xuesong Zheng, Ningbo (CN); Qiankun Yang, Ningbo (CN)

(73) Assignee: Ningbo University, Ningbo (CN)

( * ) Notice: Subject to any disclaimer, the term of this patent is extended or adjusted under 35 U.S.C. 154(b) by 0 days.

(21) Appl. No.: 14/221,263

(22) Filed: Mar. 20, 2014

(65) Prior Publication Data

US 2014/0292373 A1  Oct. 2, 2014

(30) Foreign Application Priority Data

Apr. 2, 2013 (CN) .......................... 2013 1 0113072

(51) Int. Cl.
 *H03K 19/096* (2006.01)
(52) U.S. Cl.
 CPC .................................. *H03K 19/0963* (2013.01)
 USPC .................................. 326/97; 326/93; 326/113
(58) Field of Classification Search
 None
 See application file for complete search history.

(56) References Cited

U.S. PATENT DOCUMENTS

| | | | | |
|---|---|---|---|---|
| 4,985,643 A * | 1/1991 | Proebsting | ....................... | 326/17 |
| 5,015,882 A * | 5/1991 | Houston et al. | .................. | 326/98 |
| 5,343,090 A * | 8/1994 | Proebsting | ....................... | 326/21 |
| 5,399,921 A * | 3/1995 | Dobbelaere | .................... | 326/113 |
| 5,642,061 A * | 6/1997 | Gorny | ............................. | 326/97 |
| 5,670,898 A * | 9/1997 | Fang | ................................. | 326/93 |
| 5,859,548 A * | 1/1999 | Kong | ............................. | 326/113 |
| 5,867,036 A * | 2/1999 | Rajsuman | ....................... | 326/16 |
| 5,930,322 A * | 7/1999 | Yang et al. | ...................... | 377/48 |
| 5,973,514 A * | 10/1999 | Kuo et al. | ........................ | 326/98 |
| 6,002,272 A * | 12/1999 | Somasekhar et al. | ........... | 326/98 |
| 6,014,041 A * | 1/2000 | Somasekhar et al. | ......... | 326/115 |
| 6,046,608 A * | 4/2000 | Theogarajan | .................. | 326/121 |
| 6,060,910 A * | 5/2000 | Inui | ................................. | 326/98 |
| 6,150,869 A * | 11/2000 | Storino et al. | ................. | 327/534 |
| 6,300,819 B1 * | 10/2001 | De et al. | ......................... | 327/534 |
| 6,316,962 B1 * | 11/2001 | Kwon | ............................. | 326/113 |
| 6,362,659 B1 * | 3/2002 | Fulkerson | ...................... | 326/121 |
| 6,373,290 B1 * | 4/2002 | Forbes | ............................ | 326/98 |
| 6,407,585 B1 * | 6/2002 | Vinh | ................................ | 326/98 |
| 6,492,839 B2 * | 12/2002 | Wang et al. | ..................... | 326/98 |
| 6,509,761 B2 * | 1/2003 | Taki | ................................ | 326/112 |
| 6,833,735 B2 * | 12/2004 | Kumar et al. | .................... | 326/95 |
| 6,842,046 B2 * | 1/2005 | Tzartzanis et al. | .............. | 326/98 |

* cited by examiner

*Primary Examiner* — Crystal L Hammond
(74) *Attorney, Agent, or Firm* — Matthias Scholl P.C.; Matthias Scholl

(57) ABSTRACT

A ternary T arithmetic circuit, including: a logic 0 gate circuit, a logic 1 gate circuit, and a logic 2 gate circuit. The logic 0 gate circuit includes: a first PMOS, a second PMOS, a third PMOS, a first NMOS, a second NMOS, a third NMOS, a fourth NMOS, and a fifth NMOS. The logic 2 gate circuit includes: a fourth PMOS, a fifth PMOS, a sixth NMOS, a seventh NMOS, and an eighth NMOS. The logic 1 gate circuit includes: a sixth PMOS, a seventh PMOS, a ninth NMOS, a tenth NMOS, an eleventh NMOS, and a twelfth NMOS.

1 Claim, 8 Drawing Sheets

US 8,937,493 B2

TERNARY T ARITHMETIC CIRCUIT

CROSS-REFERENCE TO RELATED APPLICATIONS

Pursuant to 35 U.S.C. §119 and the Paris Convention Treaty, this application claims the benefit of Chinese Patent Application No. 201310113072.2 filed Apr. 2, 2013, the contents of which are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The invention relates to a T arithmetic circuit, and more particularly to a ternary T arithmetic circuit based on adiabatic Domino logic.

2. Description of the Related Art

With the development of the integrated circuit technology, the route area has been a primary factor restricting the chip area. The theory of the multi-valued logic provides an effective way for decreasing the area of the internal wiring and the area of the chip. Meanwhile, when dealing with the same amount of information, the number of the transmission lines for the multi-valued signals carrying with a large amount of information is much less than that for the binary signals, thereby effectively improving the space utilization and the time utilization of the circuit, and thus, the study of the multi-valued logic has attracted more and more attention in recent years. As a generally used multi-valued operator, T operator is capable of realizing the operation set of multi-valued algebraic completion, and the formation of T operation algebraic is very important for the study of the multi-valued logic. The T operation circuit is able to fulfill any multi-valued logic circuit by constructing the T operation network and is one of the basic multi-valued circuit units.

Compared with the static CMOS circuit, the Domino circuit is advantageous in the area and the speed, thereby being much widely applied in the modern high performance microprocessor. However, the Domino circuit has a relatively high switching activity due to the periodic precharge and discharge, and thus, the energy consumption of the Domino circuit is relatively high. An adiabatic circuit (namely energy recovery circuit) adopts the AC pulse power and utilizes a method including transmitting the energy from the power supply to the node capacitance and then returning the energy to the power supply rather than the conventional method that includes transmitting the energy to a node capacitance from the power supply and then to the ground. Thus, the conventional energy is prevented from being directly converted into the consumption of heat energy, and most of the energy is returned to the power supply for a next cycle of utilization, thereby largely decreasing the power consumption of the circuit.

Thus, it is desired to combine the adiabatic technology and the Domino logic to the T operation circuit to develop a ternary T arithmetic circuit based on an adiabatic Domino logic.

SUMMARY OF THE INVENTION

In view of the above-described problems, it is one objective of the invention to provide a ternary T arithmetic circuit based on an adiabatic Domino logic, the circuit of the invention has low power consumption and correct logic function.

To achieve the above objective, in accordance with one embodiment of the invention, there is provided a ternary T arithmetic circuit based on an adiabatic Domino logic, the circuit comprising: a logic 0 gate circuit, the logic 0 gate circuit comprising: a first PMOS, a second PMOS, a third PMOS, a first NMOS, a second NMOS, a third NMOS, a fourth NMOS, and a fifth NMOS; a logic 2 gate circuit, the logic 2 gate circuit comprising: a fourth PMOS, a fifth PMOS, a sixth NMOS, a seventh NMOS, and an eighth NMOS; and a logic 1 gate circuit, the logic 1 gate circuit comprising: a sixth PMOS, a seventh PMOS, a ninth NMOS, a tenth NMOS, an eleventh NMOS, and a twelfth NMOS. A gate electrode of the first PMOS, a gate electrode of the second PMOS, a gate electrode of the fourth PMOS, a gate electrode of the sixth PMOS, a gate electrode of the second NMOS, a gate electrode of the fourth NMOS, a gate electrode of the seventh NMOS, and a gate electrode of the eleventh NMOS are connected and a connecting terminal thereof is accessed with a first clock signal. A source of the first PMOS, a source of the second PMOS, a source of the fourth PMOS, a source of the sixth PMOS, a source of the second NMOS, a source of the fourth NMOS, a gate electrode of the fifth NMOS, a source of the seventh NMOS, a gate electrode of the eighth NMOS, a source of the eleventh NMOS, and a gate electrode of the twelfth NMOS are connected and a connecting terminal thereof is accessed with a second clock signal. The first clock signal and the second clock signal have the same amplitude value, and a phase difference between the first clock signal and the second clock signal is 180°. A drain of the first PMOS, a drain of the first NMOS, and a gate electrode of the third NMOS are connected. A source of the first NMOS is connected to a drain of the second NMOS. A drain of the second PMOS, a drain of the third NMOS, a gate electrode of the third PMOS, and a gate electrode of the ninth NMOS are connected. A source of the third NMOS is connected to a drain of the fourth NMOS. A drain of the third PMOS is connected to a drain of the fifth NMOS. A drain of the fourth PMOS, a gate electrode of the fifth PMOS, a drain of the sixth NMOS, and a gate electrode of the tenth NMOS are connected. A source of the sixth NMOS is connected to a drain of the seventh NMOS. A drain of the fifth PMOS is connected to a drain of the eighth NMOS. A drain of the sixth PMOS, a gate electrode of the seventh PMOS, and a drain of the ninth NMOS are connected. A source of the ninth NMOS is connected to a drain of the tenth NMOS. A source of the tenth NMOS is connected to a drain of the eleventh NMOS. A drain of the seventh PMOS is connected to a drain of the twelfth NMOS. A gate electrode of the first NMOS and a gate electrode of the sixth NMOS are connected and a connecting terminal thereof functions as a ternary gating signal input terminal of the ternary T arithmetic circuit based on the adiabatic Domino logic. A source of the third PMOS, a source of the fifth NMOS, a source of the fifth PMOS, a source of the eighth NMOS, a source of the seventh PMOS, and a source of the twelfth NMOS are connected and a connecting terminal thereof functions as a signal output terminal of the ternary T arithmetic circuit based on the adiabatic Domino logic.

Advantages of the invention are summarized as follows:

The T arithmetic circuit of the invention is combined with the adiabatic technology and the Domino logic. The switch-level expression of the ternary T arithmetic circuit based on the adiabatic Domino logic is derived according to definitions of the T operation and the literal operation and the theory of the switch signal, thereby obtaining the T arithmetic circuit comprising the logic 0 gate circuit, the logic 1 gate circuit, and the logic 2 gate circuit. By combining the Domino circuit, the adiabatic circuit, and the multi-valued circuit, the ternary T arithmetic circuit based on the adiabatic Domino adopts the method of transmitting the energy from the power supply to the node capacitance and then returning the energy to the power supply, thus, a large portion of the energy is recovered by the power supply for a next cycle of utilization. Based on the test results of the logic function and low power consumption by HSPICE, it is known that the ternary T arithmetic circuit based on the adiabatic Domino of the invention totally satisfies the function of the ternary T arithmetic circuit and has the correct logic function; besides, the energy consumption of the ternary T arithmetic circuit is 51.79% lower than that of the common ternary T arithmetic circuit based on Domino logic, thereby featuring in low energy consumption.

BRIEF DESCRIPTION OF THE DRAWINGS

The invention is described hereinbelow with reference to the accompanying drawings, in which.

DETAILED DESCRIPTION OF THE EMBODIMENTS

For further illustrating the invention, experiments detailing a ternary T arithmetic circuit based on an adiabatic Domino logic are described below. It should be noted that the following examples are intended to describe and not to limit the invention.

A ternary T arithmetic circuit based on an adiabatic Domino logic comprises: a logic 0 gate circuit, a logic 1 gate circuit, and a logic 2 gate circuit.

Figure 1:
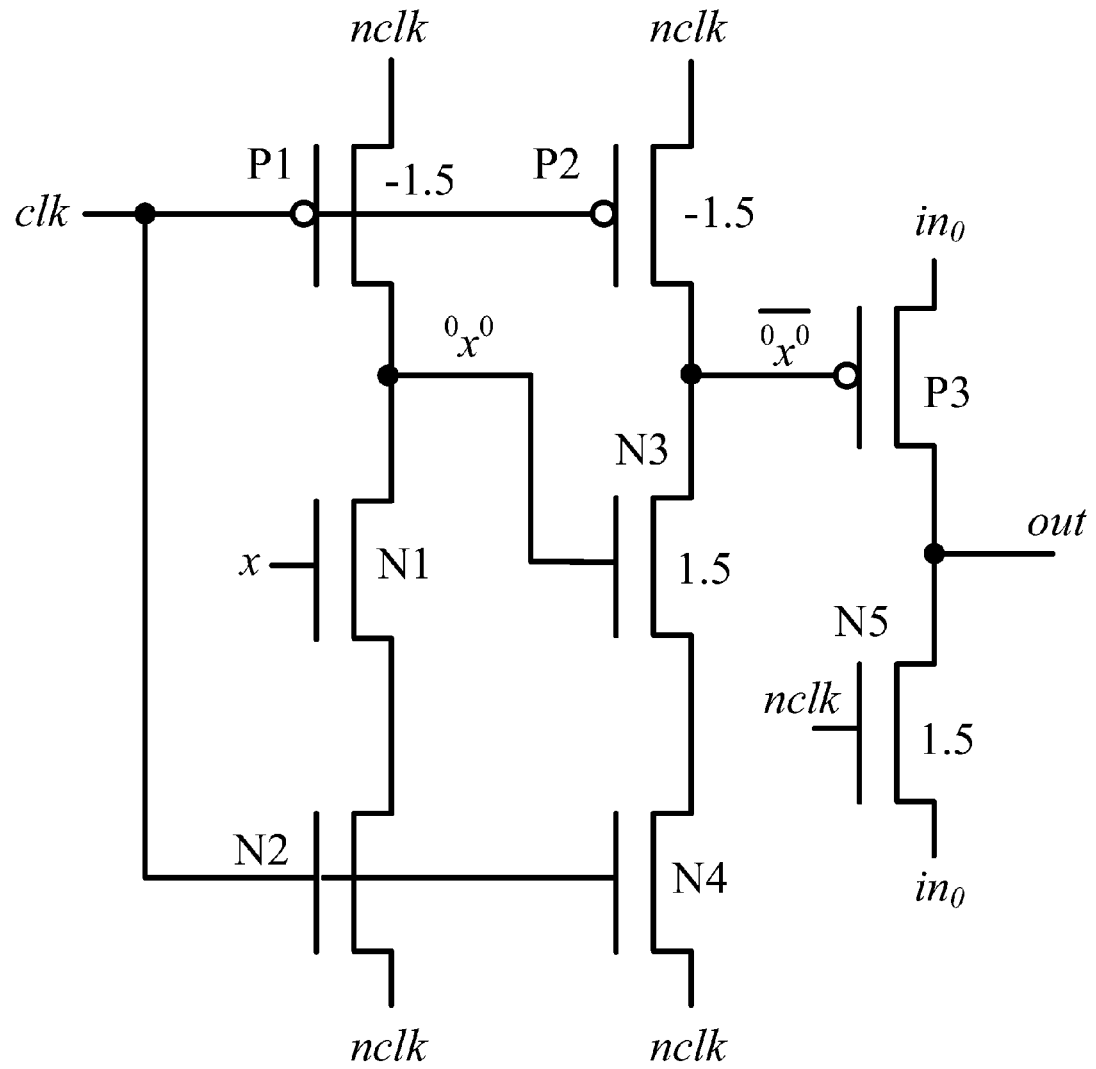
FIG. 1 is a circuit diagram of a logic 0 gate circuit in accordance with one embodiment of the invention.
Figure 2:
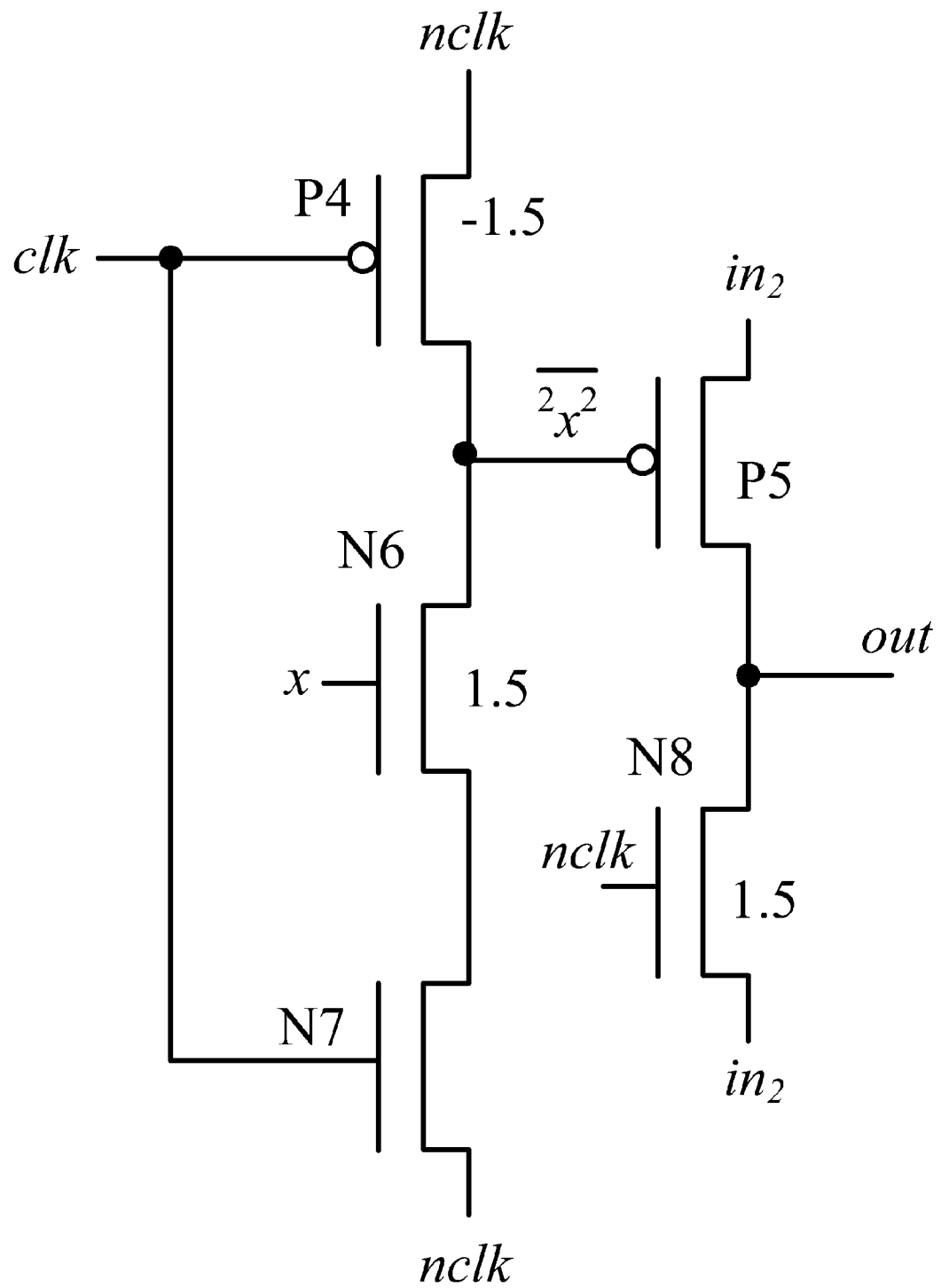
FIG. 2 is a circuit diagram of a logic 2 gate circuit in accordance with one embodiment of the invention.
Figure 3:
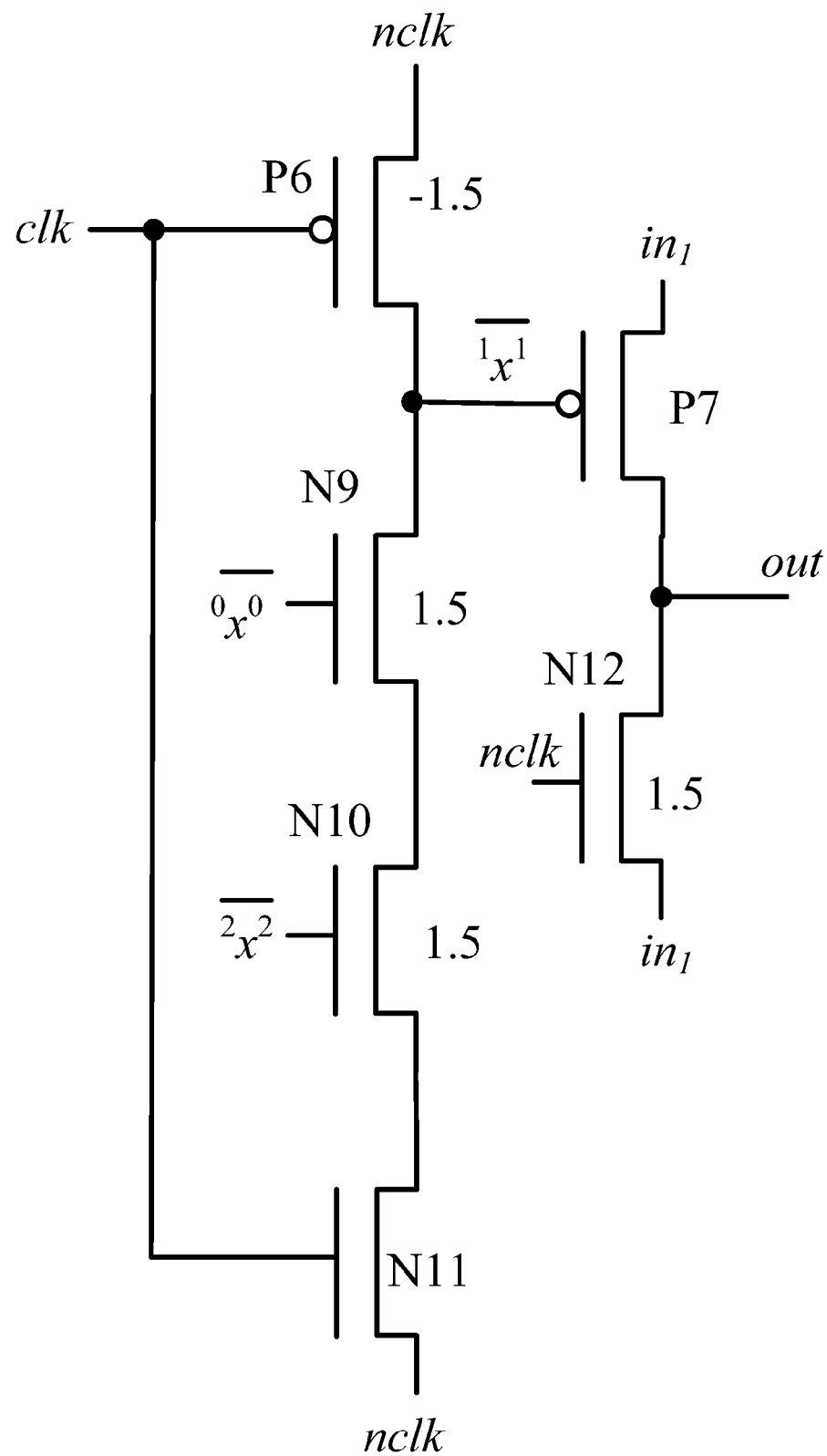
FIG. 3 is a circuit diagram of a logic 1 gate circuit in accordance with one embodiment of the invention.
Figure 5:
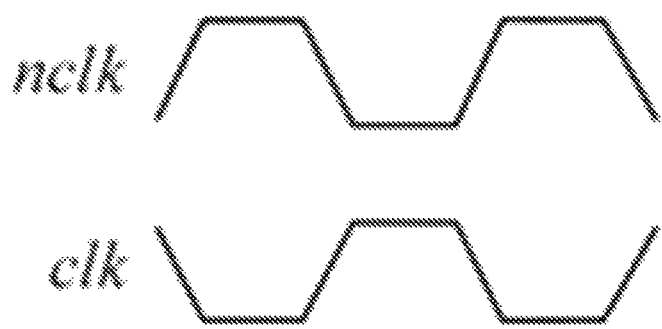
FIG. 5 is an oscillogram of a first clock signal and a second clock signal in accordance with one embodiment of the invention.

As shown in FIG. 1, the logic 0 gate circuit comprises: a first PMOS P1, a second PMOS P2, a third PMOS P3, a first NMOS N1, a second NMOS N2, a third NMOS N3, a fourth NMOS N4, and a fifth NMOS N5. As shown in FIG. 2, the logic 2 gate circuit comprising: a fourth PMOS P4, a fifth PMOS P5, a sixth NMOS N6, a seventh NMOS N7, and an eighth NMOS N8. As shown in FIG. 3, the logic 1 gate circuit comprising: a sixth PMOS P6, a seventh PMOS P7, a ninth NMOS N9, a tenth NMOS N10, an eleventh NMOS N11, and a twelfth NMOS N12. A gate electrode of the first PMOS P1, a gate electrode of the second PMOS P2, a gate electrode of the fourth PMOS P4, a gate electrode of the sixth PMOS P6, a gate electrode of the second NMOS N2, a gate electrode of the fourth NMOS N4, a gate electrode of the seventh NMOS N7, and a gate electrode of the eleventh NMOS N11 are connected and a connecting terminal thereof is accessed with a first clock signal clk. A source of the first PMOS P1, a source of the second PMOS P2, a source of the fourth PMOS P4, a source of the sixth PMOS P6, a source of the second NMOS N2, a source of the fourth NMOS N4, a gate electrode of the fifth NMOS N5, a source of the seventh NMOS N7, a gate electrode of the eighth NMOS N8, a source of the eleventh NMOS N11, and a gate electrode of the twelfth NMOS N12 are connected and a connecting terminal thereof is accessed with a second clock signal nclk. The first clock signal clk and the second clock signal nclk have the same amplitude value, and a phase difference between the first clock signal clk and the second clock signal nclk is 180°, as shown in FIG. 5. A drain of the first PMOS P1, a drain of the first NMOS N1, and a gate electrode of the third NMOS N3 are connected. A source of the first NMOS N1 is connected to a drain of the second NMOS N2. A drain of the second PMOS P2, a drain of the third NMOS N3, a gate electrode of the third PMOS P3, and a gate electrode of the ninth NMOS N9 are connected. A source of the third NMOS N3 is connected to a drain of the fourth NMOS N4. A source of the third PMOS P3 is connected to a source of the fifth NMOS N5, and a connecting terminal thereof functions as a first signal input terminal for accessing a first input signal $in_0$. A drain of the fourth PMOS P4, a gate electrode of the fifth PMOS P5, a drain of the sixth NMOS N6, and a gate electrode of the tenth NMOS N10 are connected. A source of the sixth NMOS N6 is connected to a drain of the seventh NMOS N7. A source of the fifth PMOS P5 is connected to a source of the eighth NMOS N8 and a connecting terminal thereof functions as a second signal input terminal for accessing a second input signal $in_2$. A drain of the sixth PMOS P6, a gate electrode of the seventh PMOS P7, and a drain of the ninth NMOS N9 are connected. A source of the ninth NMOS N9 is connected to a drain of the tenth NMOS N10. A source of the tenth NMOS N10 is connected to a drain of the eleventh NMOS N11. A source of the seventh PMOS P7 is connected to a source of the twelfth NMOS N12 and a connecting terminal thereof functions as a third signal input terminal for accessing a second input signal $in_1$ . . . . A gate electrode of the first NMOS N1 and a gate electrode of the sixth NMOS N6 are connected and a connecting terminal thereof functions as a ternary gating signal input terminal of the ternary T arithmetic circuit based on the adiabatic Domino logic for accessing a ternary gating signal x. A drain of the third PMOS P3, a drain of the fifth NMOS N5, a drain of the fifth PMOS P5, a drain of the eighth NMOS N8, a drain of the seventh PMOS P7, and a drain of the twelfth NMOS N12 are connected and a connecting terminal thereof functions as a signal output terminal of the ternary T arithmetic circuit based on the adiabatic Domino logic for outputting a ternary output signal out.

The principle and process of the design of the ternary T arithmetic circuit based on the adiabatic Domino logic are as follows:

1. The switching signal theory is introduced.

In the switching algebra, values of switching variables α, β are T and F, respectively representing the turn-on and turn-off states of the transistor, and the switching algebra includes a logic AND (·), OR (+), and NOR () basic operations. In signal algebra, values of signal variables x, y are selected from 0, 1, . . . , and m−1 for representing m kinds of voltage signals of the multi-valued circuit, and the signal algebra includes minimum operation (∩), maximum operation (U), and text operation ($^ix^j$).

Figure 6:
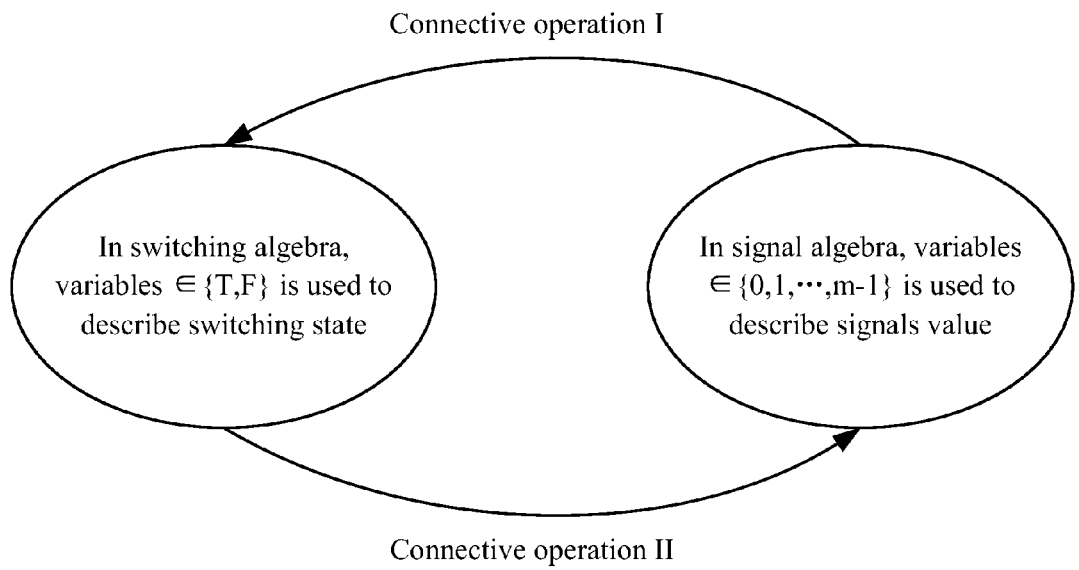
FIG. 6 is a structure diagram of a switching-signal algebra system in accordance with one embodiment of the invention.

The switching algebra and the signal algebra are not independent from each other, and the relationship thereof is shown in FIG. 6. A connective operation I is used to describe the physical process of the switching state of the signal control component. A connective operation II is used to describe the physical process of the transmission and formation of the signal controlled by the switching state of the components.

The connective operation I primarily includes a high threshold comparison operation and a low threshold comparison operation:

The high threshold comparison operation is $^t x = \begin{cases} T & x > t \\ F & x < t \end{cases}$ (1)

The low threshold comparison operation is $x^t = \begin{cases} T & x < t \\ F & x > t \end{cases}$ (2)

The connective operation II basically includes a transmission operation and an union operation:

The transmission operation is $S * \alpha = \begin{cases} S & \alpha = T \\ \Phi' & \alpha = F \end{cases}$ (3)

The union operation is $S_1 * \alpha_1 \# S_2 * \alpha_2 = \begin{cases} S_1 * \alpha_1 & (\alpha_2 = F) \\ S_2 * \alpha_2 & (\alpha_1 = F) \end{cases}$ (4)

In the arithmetic expression (3), S represents a transmission source, $\Phi'$ represents a high-impedance state, * represents a transmission operation; and $S_1$ and $S_2$ of the arithmetic expression (4) represent two different transmission sources, respectively. A priority level of the transmission "*" is higher than that of the union operation "#". Furthermore, in case of short circuit current, $\alpha_1$ and $\alpha_2$ is not allowed to be T (turn-on state) when $S_1 \neq S_2$. The following properties are derived according to the definition of the arithmetic expressions (3) and (4):

A parallel control law is: $x*\alpha\#x*\beta=x*(\alpha+\beta)$ (5)

A series control law is: $(x*\alpha)*\beta=x*(\alpha\cdot\beta)$ (6)

A commutative law is: $x*a\#y*\beta=y*\beta\#x*\alpha$ (7)

From the above relationships, it is known that the transmission of the output signal in the CMOS circuit can be realized directly by the switching of the transistor controlled by the voltage.

2. The ternary T arithmetic is introduced.

T arithmetic circuit is a multi-functional logic component. T arithmetic is capable of realizing any of the multi-valued logic functions and is very important in the design of the ternary circuit. The ternary T arithmetic circuit is defined as:

$T(in_0, in_1, in_2; x) = \begin{cases} in_0, & x = 0, \\ in_1, & x = 1, \\ in_2, & x = 2, \end{cases}$ (8)

x in the arithmetic expression (8) represents ternary gating signals. $in_0$, $in_1$, and $in_2$ represent three input signals, respectively. The ternary gating signal x functions in controlling the transmission of the signals of $in_0$, $in_1$, and $in_2$. When x=0, $in_0$ is transmitted to the output terminal; when x=1, $in_1$ is transmitted to the output terminal; and when x=2, $in_2$ is transmitted to the output terminal. Similar to a data selector able to select one from two data in binary algebra, the arithmetic circuit is capable of realizing the data selection arithmetic for selecting one from three data. By combining with the text operation, the arithmetic expression (8) is as follows:

$T(in_0, in_1, in_2; x) = in_0 \cdot {^0x^0} + in_1 \cdot {^1x^1} + in_2 \cdot {^2x^2}$ (9)

in which, the ternary text operation is defined as:

$^i x^i = \begin{cases} 2, & x = i, \\ 0, & x \neq i, i \in \{0, 1, 2\}. \end{cases}$ (10)

according to the mutually exclusive and complementary relations in the text operation, the following property is obtained:

$\overline{^i x^i} = {^j x^j} + {^k x^k} = \overline{^i x^i}, i \neq j \neq k. j, k \in \{0,1,2\}$ (11)

The ternary low-power T arithmetic circuit based on the adiabatic Domino logic is designed according to the switching signal theory and the T arithmetic definition of expression (9). The N type adiabatic Domino circuit produces the control signal $\dot{x}^i$, and the selective transmission of data is fulfilled by the P type adiabatic Domino circuit.

3. The logic gate circuits of logic 0 and logic 2 are designed.

Providing that a first clock signal is clk and a second clock signal is nclk, and a phase difference between clk and nclk is 180°. x represents the ternary gating signal. According to the definition of the text operation and the switching signal theory, switch-level expressions of the output nodes $^0x^0$ and $\dot{x}^0$ are as follows:

$^0x^0 = nclk*clk^{1.5}\#nclk*(^{0.5}clk\cdot^{0.5}x)$ (12)

$\overline{\dot{x}^0} = nclk*clk^{1.5}\#nclk*(^{0.5}clk\cdot^{1.5} {^0x^0})$. (13)

Working process of the Domino includes a precharge phase and an evaluate phase. When clk=0, the first term $nclk*clk^{1.5}$ in the expressions (12) and (13) represents that the nodes $^0x^0$ and $\dot{x}^0$ are precharged by the second clock signal nclk. When clk=2, the second term $^{0.5}clk\cdot^{0.5}x$ of the expression (12) is connected if x≠0 is input, the electric charge stored at the node$x^0$ is recovered by the nclk, $^0x^0=0$ is output, while the second term $^{0.5}clk\cdot^{1.5} {^0x^0}$ of the expression (13) is cutoff, the electric charge stored at the node $\dot{x}^0$ remains constant, and $\dot{x}^0=2$ is output; and if x=0 is input, $^{0.5}clk\cdot^{0.5}x$ is cutoff, $^0x^0=2$ is output, $^{0.5}clk\cdot^{1.5} {^0x^0}$ is connected, the electric charge stored at the node $\dot{x}^0$ is recovered by nclk, and $\dot{x}^0=0$ is output, thereby realizing the Domino evaluate phase. The NMOS controlled by the signal $^0x^0$ adopts the high threshold for reducing the charge loss due to the series connection of the N type Domino circuit and ensuring the correct operation of the circuit. The selective output of the $in_0$ signal is reached by controlling the P type Domino circuit by the signal $\dot{x}^0$, and a switch-level expression thereof are as follows:

$\overline{^2x^2} = nclk*clk^{1.5}\#nclk*(^{0.5}clk\cdot^{1.5}x)$, (15)

$out = in_2 * \overline{^2x^2}^{0.5}\#in_2*^{1.5}nclk$. (16)

Circuit structure of corresponding logic 0 gate circuit is obtained according to expressions (12)-(14), and the circuit is as shown in FIG. 1.

Similarly, switch-level expressions of the logic 2 gate circuit are as follows:

$$\text{out} = in_0 * \overline{^0x^0}^{0.5} \# in_0 * ^{1.5}nclk. \quad (14)$$

The electric circuit of the logic 2 gate circuit is obtained according to the expressions (15) and (16), and the circuit diagram thereof is shown in FIG. 2. A second term $^{1.5}x$ in the expression (15) represents the evaluate phase, if x=0 and 1, the electric charge stored at the node $\hat{x}^2$ will not be recovered by nclk due to that the input signal x is less than the threshold voltage, and $\hat{x}^2 = 2$ is output. When x=2, the second term $^{1.5}x$ in the expression (15) is turned on, $\hat{x}^2 = 0$ is output, thereby turning on the $\hat{x}^{2\ 0.5}$ in the expression (16) and realizing the transmission of the signal $in_2$.

4. The logic 1 gate circuit is designed.

Because the value network of Domino circuit only includes the NMOS and the PMOS, the logic 1 in the ternary algebra is indiscriminable. According to expression (11), any text expression can be obtained from another two text expressions, thus, signal $\hat{k}^1$ is produced controlled by the signals $\hat{x}^0$ and $\hat{x}^2$, and a switch-level expression of $\hat{k}^1$ at the on-off state is as follows:

$$\overline{^1x^1} = nclk * clk^{1.5} \# nclk * (^{0.5}clk \cdot ^{1.5}\overline{^0x^0} \cdot ^{1.5}{^2x^2}), \quad (17)$$

When clk=0, the first term $clk^{1.5}$ is turned on, the second term $^{0.5}clk$ is cutoff, the node $\hat{k}^1$ is precharged to a high level by nclk. When clk=2, the first term is cutoff, if $\hat{x}^0$ and $\hat{x}^2$ are equal to 2 (that is, x=1), the electric charge stored at the node $\hat{k}^1$ is recovered by nclk, and $\hat{k}^1 = 0$ is output, otherwise, the first term continuous to be cutoff, and $\hat{k}^1 = 2$ is output.

The selective transmission of signal $in_1$ is controlled by signal $\hat{k}^1$, and a switch-level expression thereof is as follows:

$$\text{out} = in_1 * \overline{^1x^1}^{0.5} \# in_1 * ^{1.5}nclk. \quad (18)$$

A switch-level circuit structure of the logic 1 gate circuit is obtained according to expressions (17) and (18), and the circuit diagram thereof is shown in FIG. 3.

Figure 4:
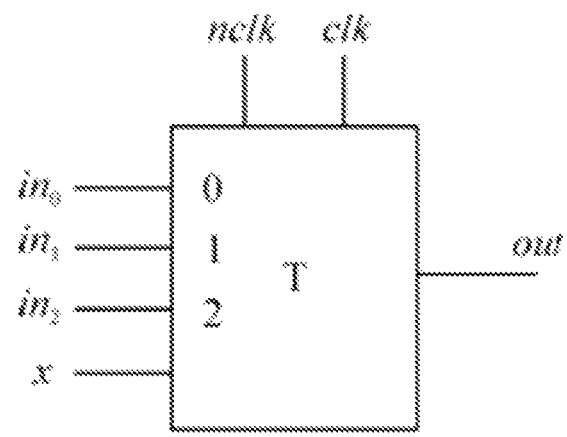
FIG. 4 is a symbol diagram of a ternary T arithmetic circuit based on adiabatic Domino logic of the invention in accordance with one embodiment of the invention.

5. Common terminals of the logic 0 gate circuit, logic 1 gate circuit, and logic 2 gate circuit are connected for obtaining the ternary low-power T arithmetic circuit based on the adiabatic Domino logic, and a symbol diagram thereof is shown in FIG. 4.

The ternary low-power T arithmetic circuit based on the adiabatic Domino logic is simulated in condition of TSMC 0.25 μm of the CMOS process parameter. The width to length ratio of the NMOS is W/L=3λ/2λ, the width to length ratio of the PMOS is W/L=6λ/2λ. The logic 0, 1, and 2 are corresponding to the physical voltage of 0 V, 1.25 V, and 2.5 V, a load capacitance is 10 fF, and a working frequency is 25 MHz.

Figure 7:
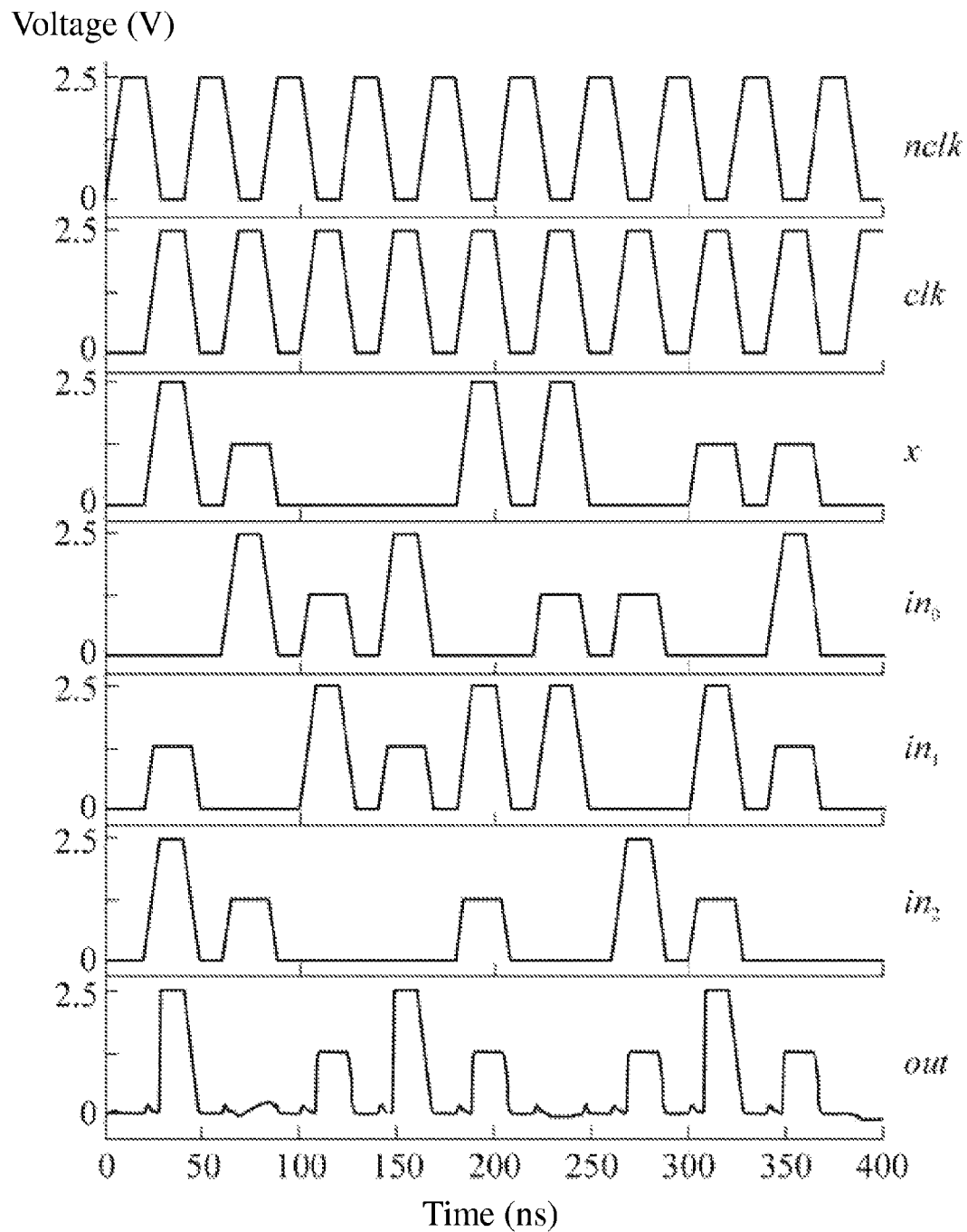
FIG. 7 is a transient characteristic curve of a ternary T arithmetic circuit based on adiabatic Domino logic in accordance with one embodiment of the invention.

A transient characteristic curve of the ternary low-power T arithmetic circuit based on the adiabatic Domino logic is shown in FIG. 7. If the gating signal x=2, $in_0$=0, $in_1$=1, $in_2$=2, out=$in_2$=2 will be output; if x=1, $in_0$=2, $in_1$=0, and $in_2$=1, out=$in_1$=0 will be output; and if x=0, $in_0$=1, $in_1$=2, and $in_2$=0, out=$in_0$=1 will be output. From analyses of other conditions, it is known that the ternary low-power T arithmetic circuit based on the adiabatic Domino logic totally coincides with the function of the ternary T arithmetic circuit and has the correct logic function.

Figure 8:
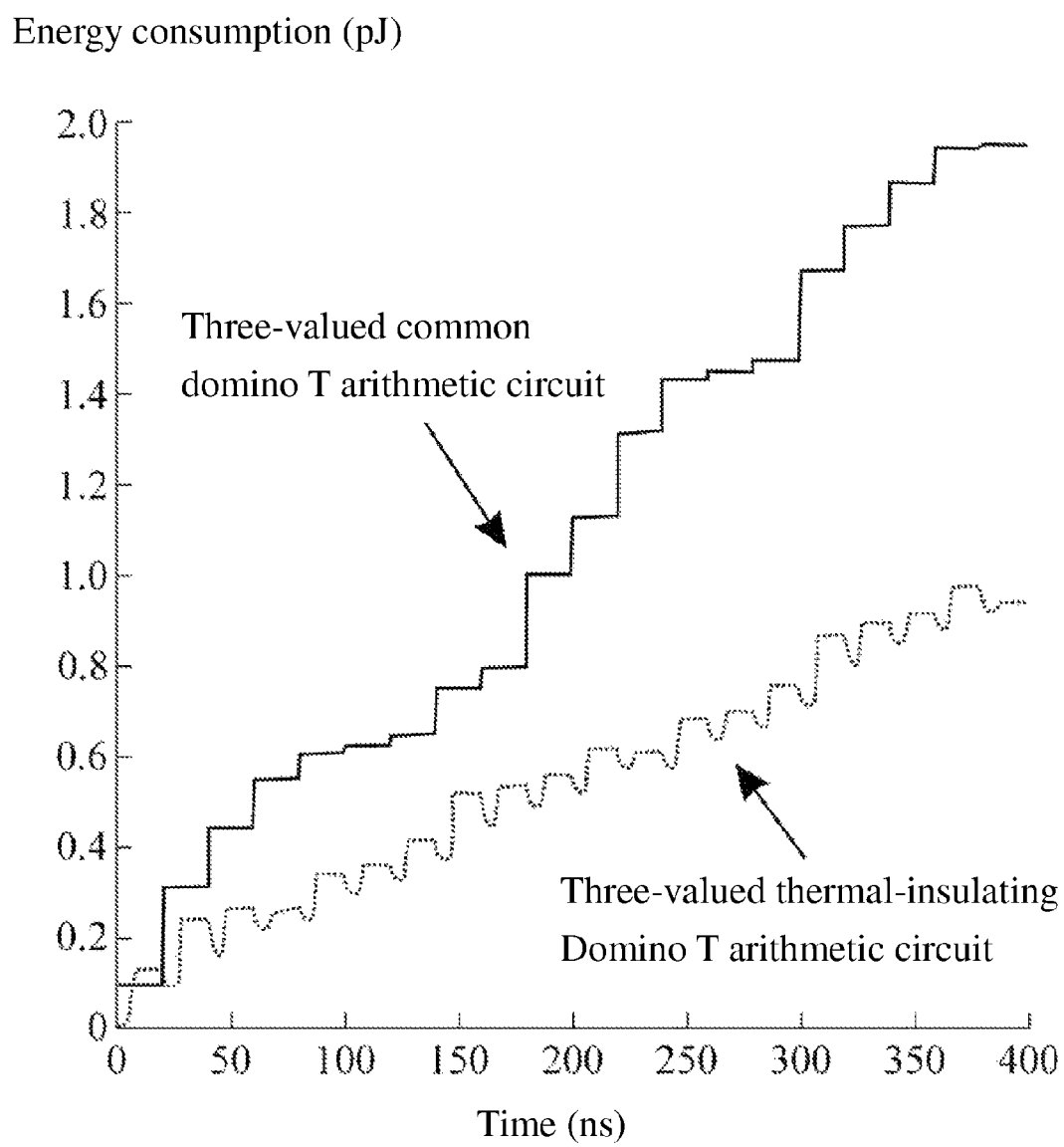
FIG. 8 is a comparison chart of transient energy consumption between a ternary T arithmetic circuit based on adiabatic Domino logic of the invention and a ternary common Domino T arithmetic circuit.

A comparison chart of transient energy consumption between a ternary low-power T arithmetic circuit based on adiabatic Domino logic of the invention and a ternary common Domino T arithmetic circuit is shown in FIG. 8.

The wave like curve is the energy consumption curve of the adiabatic Domino T arithmetic circuit, the energy supply from the power supply to the circuit and the energy recovery are represented by the rising part and falling part of the curve, and the energy consumption of the circuit is represented by the ascending part. When the working frequency is 25 MHz, under the same process parameters and the same output conditions, the energy consumption of the ternary low-power T arithmetic circuit based on the adiabatic Domino logic of the invention is 51.79% lower than that of the ternary common Domino T arithmetic circuit within 400 ns, thereby possessing a prominent characteristic of low-power consumption.

The ternary low-power T arithmetic circuit based on the adiabatic Domino logic of the invention adopts the design of the adiabatic Domino logic, has prominent property of low-power consumption, and possesses a simple structure. Compared with the adiabatic T arithmetic circuit in the prior art, the number of the transistors is saved by 50%. As the T arithmetic network is capable of constructing any of ternary networks, the invention can be applied in design of more complicate ternary logic circuit.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A ternary T arithmetic circuit, comprising:
   a) a logic 0 gate circuit, the logic 0 gate circuit comprising: a first PMOS, a second PMOS, a third PMOS, a first NMOS, a second NMOS, a third NMOS, a fourth NMOS, and a fifth NMOS;
   b) a logic 2 gate circuit, the logic 2 gate circuit comprising: a fourth PMOS, a fifth PMOS, a sixth NMOS, a seventh NMOS, and an eighth NMOS; and
   c) a logic 1 gate circuit, the logic 1 gate circuit comprising: a sixth PMOS, a seventh PMOS, a ninth NMOS, a tenth NMOS, an eleventh NMOS, and a twelfth NMOS;
   wherein
   a gate electrode of the first PMOS, a gate electrode of the second PMOS, a gate electrode of the fourth PMOS, a gate electrode of the sixth PMOS, a gate electrode of the second NMOS, a gate electrode of the fourth NMOS, a gate electrode of the seventh NMOS, and a gate electrode of the eleventh NMOS are connected and a connecting terminal thereof is accessed with a first clock signal;
   a source of the first PMOS, a source of the second PMOS, a source of the fourth PMOS, a source of the sixth PMOS, a source of the second NMOS, a source of the fourth NMOS, a gate electrode of the fifth NMOS, a source of the seventh NMOS, a gate electrode of the eighth NMOS, a source of the eleventh NMOS, and a gate electrode of the twelfth NMOS are connected and a connecting terminal thereof is accessed with a second clock signal;

the first clock signal and the second clock signal have the same amplitude value, and a phase difference between the first clock signal and the second clock signal is 180°;

a drain of the first PMOS, a drain of the first NMOS, and a gate electrode of the third NMOS are connected;

a source of the first NMOS is connected to a drain of the second NMOS;

a drain of the second PMOS, a drain of the third NMOS, a gate electrode of the third PMOS, and a gate electrode of the ninth NMOS are connected;

a source of the third NMOS is connected to a drain of the fourth NMOS;

a drain of the third PMOS is connected to a drain of the fifth NMOS;

a drain of the fourth PMOS, a gate electrode of the fifth PMOS, a drain of the sixth NMOS, and a gate electrode of the tenth NMOS are connected;

a source of the sixth NMOS is connected to a drain of the seventh NMOS;

a drain of the fifth PMOS is connected to a drain of the eighth NMOS;

a drain of the sixth PMOS, a gate electrode of the seventh PMOS, and a drain of the ninth NMOS are connected;

a source of the ninth NMOS is connected to a drain of the tenth NMOS;

a source of the tenth NMOS is connected to a drain of the eleventh NMOS;

a drain of the seventh PMOS is connected to a drain of the twelfth NMOS;

a gate electrode of the first NMOS and a gate electrode of the sixth NMOS are connected and a connecting terminal thereof functions as a ternary gating signal input terminal of the ternary T arithmetic circuit based on the adiabatic Domino logic; and a source of the third PMOS, a source of the fifth NMOS, a source of the fifth PMOS, a source of the eighth NMOS, a source of the seventh PMOS, and a source of the twelfth NMOS are connected and a connecting terminal thereof functions as a signal output terminal of the ternary T arithmetic circuit based on the adiabatic Domino logic.

* * * * *